(12) United States Patent
Flach et al.

(10) Patent No.: US 7,426,669 B2
(45) Date of Patent: Sep. 16, 2008

(54) CIRCUIT ARRANGEMENT AND METHOD FOR DRIVING ELECTRONIC CHIPS

(75) Inventors: Björn Flach, Vila do Condo (PT); Andreas Logisch, München (DE); Wolfgang Ruf, Friedberg (DE); Michael Schittenhelm, Poing (DE); Martin Schnell, München (DE)

(73) Assignee: Infineon Technologies AG, Munich (DE)

( * ) Notice: Subject to any disclaimer, the term of this patent is extended or adjusted under 35 U.S.C. 154(b) by 720 days.

(21) Appl. No.: 10/853,768

(22) Filed: Oct. 14, 2004

(65) Prior Publication Data

US 2005/0138491 A1    Jun. 23, 2005

(30) Foreign Application Priority Data

May 27, 2003    (DE)    ............................... 103 24 080

(51) Int. Cl.
*G01R 31/28*    (2006.01)
(52) U.S. Cl. ..................................... 714/736
(58) Field of Classification Search .................. 714/724, 714/742, 736

See application file for complete search history.

(56) References Cited

U.S. PATENT DOCUMENTS

| 6,640,323 | B2 * | 10/2003 | Akram | 714/724 |
| 7,185,255 | B2 * | 2/2007 | Shibuya | 714/738 |
| 7,228,474 | B2 * | 6/2007 | Williams et al. | 714/726 |
| 2005/0034043 | A1 * | 2/2005 | Takizawa | 714/742 |

FOREIGN PATENT DOCUMENTS

| DE | 199 37 820 C2 | 3/2000 |
| EP | 1 212 629 B1 | 11/2004 |

\* cited by examiner

*Primary Examiner*—James C Kerveros
(74) *Attorney, Agent, or Firm*—Eschweiler & Associates LLC

(57) ABSTRACT

The invention provides a method for testing circuit units to be tested in a test apparatus, different identification units being assigned to the circuit units to be tested, the circuit units to be tested being connected to the test apparatus, a tester data stream including command blocks being output from the test apparatus, the tester data stream being compared with the identification units, the circuit unit to be tested, the identification unit of which matches the tester data stream output by the test apparatus, being activated and at least one command block for this circuit unit to be tested being processed in the circuit unit to be tested, whereupon the circuit unit to be tested is deactivated.

16 Claims, 1 Drawing Sheet

CIRCUIT ARRANGEMENT AND METHOD FOR DRIVING ELECTRONIC CHIPS

CLAIM FOR PRIORITY

This application claims the benefit of priority to German Application No. 103 24 080.2, filed on May 27, 2003 in the German language, the contents of which are hereby incorporated by reference.

TECHNICAL FIELD OF THE INVENTION

The present invention relates to the testing of electronic circuit units (electronic chips) with the aid of testers, and in particular, to the individual testing of individual electronic.

BACKGROUND OF THE INVENTION

The increasing integration density and also the progressive complexity of electronic circuit units (electronic chips) result in increased requirements when testing these circuit units. At present, up to 256 electronic chips are simultaneously introduced into a test device (tester) and tested by machine. In this case, there are typically 66 connection pins (pins) per electronic chip.

Test signals or test sequences are applied to specific pins and an output signal (actual signal) which is reproduced by the electronic chip can then be compared with a predetermined test sequence (desired signal) in the tester. The functionality of the chip is determined in this manner. When faults occur in electronic chips, the possibility of providing an automatic repair mechanism is increasingly being provided in mechanical testers. Said automatic repair mechanism comprises, for example, electronic fuses ("e-fuse self-repair") such that defective memory cells, for example, are switched off and/or bridged.

Such complicated elimination of individual faults is accompanied by individual addressing of individual electronic chips. Individual addressing of individual electronic chips disadvantageously conflicts with increasing the parallelism of testing and thus shortening the test duration.

Shortening the test duration is directly accompanied by economic aspects since different test runs—for example at different temperatures—have to be provided for the chips to be tested. Different currents and internal voltages furthermore have to be individually detected in a test flow.

The requisite separate selection of electronic chips is conventionally provided, for example, by switching the supply voltage source for the corresponding chip. This is effected in such a manner that, from a group of electronic chips which are to be tested in parallel (circuit units to be tested) and are thus completely or partially connected to the same tester channels, an electronic chip is selected by switching off the supply voltage of all other electronic chips in said group.

Disadvantageously, this concept is not suitable for future test setups since parallelism of the voltage supply must also be provided, that is to say future test setups will provide supply voltage sources for a plurality of electronic chips, with the result that this type of selective addressing will not be able to be carried out. Economically, it is problematical that the test costs are taking up an ever increasing portion of the production costs. It is therefore necessary to drastically increase the number of electronic chips (electronic modules) which can be simultaneously tested on a test system in such a manner that the parallelism of testing increases. In accordance with the prior art, a signal generated by the tester or the test system is applied to a plurality of different electronic chips to be tested. However, the conventional methods disadvantageously no longer allow the individual electronic chip to be tested to be individually addressed. This fact prevents future requirements from being met in the case of e-fuse self-repair of memory modules or in the case of individual driver calibration (OCD) of DDR (Double Data Rate) II technology, in which individual addressing of electronic chips—together with highly parallel measurement at the same time—is absolutely necessary.

SUMMARY OF THE INVENTION

The present invention relates to the testing of electronic circuit units (electronic chips) with the aid of testers and relates, in particular, to the individual testing of individual electronic chips such as, for example, logic chips or memory chips by specifically driving the individual electronic chips in order to send commands or command blocks or instructions to the chips in question during parallel testing.

The present invention provides a method for testing electronic chips to be tested or circuit units to be tested, in the case of which the disadvantages of the prior art are avoided and, in particular, test sequences can be individually applied to the electronic circuit units to be tested.

The invention generally involves utilizing identification units which are assigned to the circuit units to be tested in order to apply command sequences to a specific circuit unit to be tested, the command sequences including the command blocks which are required in order to test said specific circuit unit to be tested.

One advantage of the present invention is that circuit units to be tested in a test apparatus can be individually addressed without circuit units which are not intended to be addressed having to be removed from a supply voltage.

A further advantage is that repair work on individual chips which are jointly arranged and introduced into the test apparatus is easier to accomplish. Circuit units to be tested are advantageously repaired by means of e-fuse self-repair techniques, for example.

It is also useful that predeterminable command blocks can be applied to specific circuit units to be tested in order to carry out individual test sequences. The advantage of a high degree of parallelism during testing by machine is retained in this case since command sequences can be applied in parallel to all of the circuit units to be tested. The decision as to which command sequence is relevant to a specific circuit unit to be tested is made using a specific identification unit which is assigned to the corresponding circuit unit to be tested.

In one embodiment of the invention, there is a method for testing circuit units to be tested in a test apparatus based on an assignment of different identification units to the circuit units to be tested, including:

a) connection of the circuit units to be tested to the test apparatus;
b) outputting of a tester data stream containing command blocks from the test apparatus;
c) comparison of the tester data stream output by the test apparatus with the identification units of the circuit units to be tested;
d) activation of the circuit unit to be tested, the identification unit of which matches the tester data stream output by the test apparatus, a decision being made regarding processing in step c) above;
e) processing of at least one command block in the circuit unit to be tested, the identification unit of which matches the tester data stream output by the test apparatus; and f) deactivation of the circuit unit to be tested, the identification unit of which does not match the tester data stream output by the test apparatus.

In another embodiment of the invention, there is a circuit arrangement for testing circuit units to be tested in a test apparatus, including:

a) identification units which are unambiguously assigned to the circuit units to be tested;

b) an output device for outputting a tester data stream containing command blocks from the test apparatus;

c) a comparison device for comparing the tester data stream output by the test apparatus with the identification units of the circuit units to be tested; and d) a processing unit for processing at least one command block in the circuit unit to be tested, the identification unit of which matches the tester data stream output by the test apparatus.

In accordance with one preferred embodiment of the invention, steps a) to f) above are repeated until all of the circuit units to be tested have been tested and/or repaired.

In accordance with a further preferred embodiment of the present invention, a test mode is activated whenever an identification unit of the circuit unit to be tested matches the tester data stream output by the test apparatus.

In accordance with yet another preferred embodiment of the present invention, the circuit unit to be tested is deactivated by the test mode if a command block affecting the circuit unit to be tested has been processed.

In accordance with yet another preferred embodiment of the present invention, the at least one circuit unit to be tested is tested for faults in step e) above. In this case, faults are investigated in memory modules and other units.

In accordance with yet another preferred embodiment of the present invention, the at least one circuit unit to be tested is tested for faults in step e), the faults detected in the circuit unit to be tested during testing furthermore being eliminated.

In accordance with yet another preferred embodiment of the present invention, the faults detected in the circuit unit to be tested during testing are eliminated by means of fuse units—e-fuse units.

In accordance with yet another preferred embodiment of the present invention, the identification units assigned to the circuit units to be tested are impressed on the circuit units to be tested during processing at the wafer level.

In accordance with yet another preferred embodiment of the present invention, the identification units assigned to the circuit units to be tested are impressed on the circuit units to be tested during the first wafer measurement at the wafer level.

In accordance with yet another preferred embodiment of the present invention, the identification units which are assigned to the circuit units to be tested and are impressed on the circuit units to be tested during the first wafer measurement at the wafer level are provided by means of laser fuses.

In accordance with yet another preferred embodiment of the present invention, the identification units assigned to the circuit units to be tested are temporarily provided to the circuit units to be tested as temporary identification units.

In accordance with yet another preferred embodiment of the present invention, the identification units assigned to the circuit units to be tested are provided as temporary identification units whenever the circuit units to be tested are introduced in the test apparatus and are contact-connected with the latter.

In accordance with yet another preferred embodiment of the present invention, the test mode is provided as a hardware block in the circuit arrangement or as a specific separate circuit section.

In accordance with yet another preferred embodiment of the present invention, e-fuse units are provided for eliminating faults which are detected in the circuit unit to be tested during testing, with the result that the faults in the individual circuit units to be tested can be individually eliminated.

In accordance with yet another preferred emboidment of the present invention, laser fuses are provided for impressing identification units assigned in to the circuit units to be tested during the first wafer measurement at the wafer level.

BRIEF DESCRIPTION OF THE DRAWINGS

Exemplary embodiments of the invention are illustrated in the drawing and explained in more detail in the following description.

In the drawing.

DETAILED DESCRIPTION OF THE INVENTION

Figure 1:
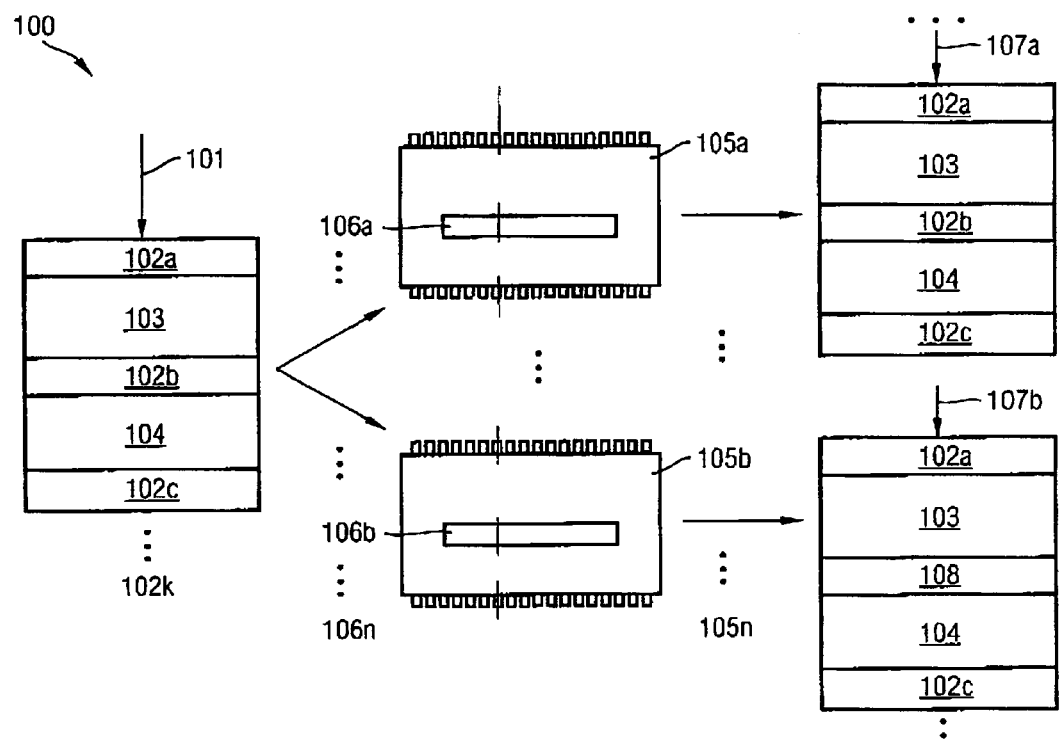
FIG. 1 shows a block diagram of the method according to the invention for testing circuit units to be tested in a test apparatus.

The block diagram shown in FIG. 1 illustrates how the components of a test apparatus 100 for testing circuit units 105a, 105b, . . . 105i, . . . 105n to be tested. In this exemplary embodiment, it shall be assumed that the total number of circuit units 105-105n to be simultaneously tested in parallel is n.

It should be pointed out that "i" is used to denote a running index, that is to say i=a, b, . . . n. In the preferred exemplary embodiment of the present invention shown in FIG. 1, a tester data stream 101 is provided by the test apparatus via an output device (not shown) of the test apparatus 100. Said tester data stream 101 preferably includes different command blocks 102a, 102b, 102c, 102i, . . . 102k. In this exemplary embodiment, the number of command blocks is k, k being a variable integer. "i" in turn represents a running index, that is to say i=a, b, c, . . . i, . . . k.

Individual command blocks 102a-102k are assigned to the individual circuit units 105a-105n to be tested via unambiguously identifiable identification units 106a-106n which are assigned to the corresponding circuit units 105a-105n to be tested. The tester data stream 101 furthermore contains a test mode activation unit 103.

The test mode activation unit 103 ensures that the electronic module (electronic circuit unit) 105a-105n identified by the corresponding identification unit 106a-106n is activated. After the corresponding command block 102b has been processed, the test mode deactivation unit 104 is used to deactivate the test mode. The circuit units 105a-105n to be tested are then active again. The block diagram illustrated in FIG. 1 shows that the circuit unit 105a to be tested receives the command block 102b, while the circuit unit 105b to be tested and the following circuit units 105c-105n receive the empty command block 108 at this point.

It is thus ensured that a command block is applied to a circuit unit to be tested only when said command block is intended for the circuit unit to be tested, that is between the activation step and the deactivation step. The corresponding command sequences 107a-107n are thus supplied to the individual circuit units 105a-105n to be tested, as illustrated on the right in the block diagram of FIG. 1.

It is assumed, in the example illustrated in FIG. 1, that the identification unit 106a of the circuit unit 105 to be tested matches the test data stream 101 output by the test apparatus 100, that is to say the circuit unit 105a to be tested is to be activated, is to have the corresponding command block 102b applied to it and is then to be deactivated. In comparison therewith, the circuit unit 105b to be tested (which is illustrated in the block diagram of FIG. 1) is not activated and does not have a command block 102b applied to it, that the command sequence 107b which is supplied to the second circuit unit 105b to be tested contains an empty command block 108 instead of the command block 102b.

The different identification units 108a-108n can now be impressed in a different manner into the corresponding circuit units 105a-105n to be tested. It is possible for the identification unit 106a-106n—also referred to as an individual identification number (ID)—to be impressed on each circuit unit 105a-105n to be tested as early as during processing of the wafer at the wafer level.

It is furthermore possible to use an already existing identification unit 106a-106n of the circuit unit 105a-105n to be tested, the identification unit having been written in during the first wafer measurement following the production of the chip (laser fuse). A test mode, which makes it possible to read the identification units of individual circuit units to be tested, is defined in a conventional manner.

The individual identification units 106a-106n (provided in this manner) of the circuit units 105a-105n to be tested now make it possible to individually address the circuit units 105a-105n to be tested in such a manner that only an activated circuit unit to be tested reacts to the individual tester data stream 101 transmitted. The other circuit units to be tested which have not been activated during this test mode sequence therefore also do not react to command blocks or command sequences present at the interface between the circuit unit to be tested and the test apparatus 100. In this case, it is possible to provide global activation corresponding to termination of he test modes, in the case of which the circuit units 105a-105n to be tested change to the normal operating mode.

A high degree of parallelism of test runs is therefore achieved. Test runs relate, for example, to investigations at different temperatures, for example test runs are carried out at −10° C., on the one hand, and at +85° C., on the other hand. During a so-called "test flow", currents and internal voltages, respectively, of the individual circuit units 105a-105n to be tested are individually detected.

In this case, it is of decisive importance that a high degree of parallelism is achieved when testing the circuit units to be tested since a long test duration gives rise to high costs and thus entails an economic disadvantage.

However, in addition to providing the high degree of test parallelism, it is necessary to individually address specific circuit units 105a-105n to be tested in order, for example, to enable individual fault checking. It is furthermore advantageous that faults which have been detected can then be eliminated on an individual circuit unit to be tested and that said circuit unit 105a-105n to be tested evades a repair process.

The economic advantage resides, inter alia, in the fact that joint use of resources such as tester channels, voltage supplies etc. makes it possible to increase the measurement parallelism.

The identification units 106a-106n mentioned may furthermore be provided as temporary identification units 106a-106n if, instead of a permanent identification unit, temporary numbering of the circuit unit to be tested is provided at that point in time at which the circuit units 105a-105n to be tested are introduced into the test apparatus 100 and are contacted with the latter. The respective identification unit can therefore be stored, for example, in nonvolatile memory cells, so that it is possible to individually address the individual circuit unit 105a-105n to be tested.

The fundamental advantage of the method according to the invention results from the fact that (i) an identification unit 106a-106n which is assigned to a specific circuit unit 105a-105n to be tested is identified,
(ii) the corresponding circuit unit 105a-105n to be tested is activated (wake-up), and
(iii) the corresponding circuit unit 105a-105n to be tested is deactivated after the relevant command block 102a-102k has been processed.

It is therefore possible to provide a high degree of parallelism when testing circuit units to be tested in a test apparatus, while it is simultaneously possible to individually address specific circuit units 105a-105n to be tested for the purposes of fault investigation and/or fault elimination.

Although the present invention has been described above with reference to preferred exemplary embodiments, it is not restricted thereto but rather may be modified in various ways.

Neither is the invention restricted to the application possibilities mentioned.

LIST OF REFERENCE SYMBOLS

100 Test apparatus
101 Tester data stream
102a, Command blocks
102b,
102c,
... 102i,
... 102k
103 Test mode activation unit
104 Test mode deativation unit
105a,
105b,
... 105i,
... 105n
106a, Identification units
106b,
... 106i,
... 106n
107a, Command sequences
107b,
... 107i,
... 107n
108 Empty command block

What is claimed is:

1. A method for testing circuit units in parallel in a test apparatus, different identification units being assigned to the circuit units to be tested, comprising:

connecting the circuit units in parallel to the test apparatus;
outputting a tester data stream containing command blocks from the test apparatus in parallel to the circuit units;
comparing the tester data stream output by the test apparatus with the different identification units of the circuit units;
activating the one of the circuit units whose identification unit matches the tester data stream output by the test apparatus;
processing at least one command block in the activated circuit unit; and
deactivating the circuit units whose identification units do not match the tester data stream output by the test apparatus.

2. The method according to claim 1, wherein the method is repeated until all of the circuit units have been tested.

3. The method according to claim 1, further comprising activiating a test mode if an identification unit of the respective circuit unit matches the tester data stream output by the test apparatus.

4. The method according to claim 1, further comprising deactivating the respective circuit unit by the test mode if a command block affecting the circuit unit has been processed.

5. The method according to claim 1, wherein the one activated circuit unit is tested for faults in the activating step.

6. The method according to claim 1, wherein the one activated circuit unit is tested for faults in the activating step, and eliminating the detected faults.

7. The method according to claim 6, wherein the faults detected in the one circuit unit during testing are eliminated by e-fuse units.

8. The method according to claim 1, wherein the identification units assigned to the circuit units are impressed on the circuit units during processing at the wafer level.

9. The method according to claim 1, wherein the identification units assigned to the circuit units are impressed on the circuit units during the first wafer measurement at the wafer level.

10. The method according to claim 9, wherein the identification units which are assigned to the circuit units and are impressed on the circuit units during the first wafer measurement at the wafer level are provided by means of laser fuses.

11. The method according to claim 1, wherein the identification units assigned to the circuit units are provided to the circuit units as temporary identification units.

12. The method according to claim 11, wherein the identification units assigned to the circuit units are provided as temporary identification units when the circuit units are introduced into the test apparatus and are contact-connected with the latter.

13. A circuit arrangement for testing circuit units in a test apparatus, comprising:

identification units which are uniquely assigned to the circuit units;

an output device configured to output a tester data stream containing command blocks from the test apparatus;

a comparison device configured to compare the tester data stream output by the test apparatus with the identification units of the circuit units; and a processing unit configured to process at least one command block in the respective circuit unit, the identification unit of which matches the tester data stream output by the test apparatus.

14. The circuit arrangement according to claim 13, wherein a test mode is provided in a hardware block.

15. The circuit arrangement according to claim 13, further comprising e-fuse units configured to eliminate faults which are detected in the respective circuit unit during testing.

16. The circuit arrangement according to claim 13, further comprising laser fuses configured to impress identification units assigned to the circuit units during the first wafer measurement at the wafer level.

* * * * *